(12) United States Patent
Biery et al.

(10) Patent No.: US 6,933,191 B2
(45) Date of Patent: Aug. 23, 2005

(54) TWO-MASK PROCESS FOR METAL-INSULATOR-METAL CAPACITORS AND SINGLE MASK PROCESS FOR THIN FILM RESISTORS

(75) Inventors: Glenn A. Biery, Staatsburg, NY (US); Zheng G. Chen, Poughkeepsie, NY (US); Timothy J. Dalton, Ridgefield, CT (US); Naftali E. Lustig, Croton-on-Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/605,260

(22) Filed: Sep. 18, 2003

(65) Prior Publication Data

US 2005/0064658 A1 Mar. 24, 2005

(51) Int. Cl.[7] .......................................... H01L 21/8242
(52) U.S. Cl. ...................... 438/239; 438/239; 438/240; 438/635; 438/636; 438/393; 438/396; 438/244
(58) Field of Search ................................ 438/239, 240, 438/244, 253, 250, 768, 396, 635, 393, 636

(56) References Cited

U.S. PATENT DOCUMENTS

| | | | |
|---|---|---|---|
| 5,349,174 A | * | 9/1994 | Van Berkel et al. ..... 250/208.1 |
| 6,278,147 B1 | | 8/2001 | Dalton et al. |
| 6,342,734 B1 | * | 1/2002 | Allman et al. .............. 257/758 |
| 6,387,754 B2 | | 5/2002 | Dalton et al. |
| 6,413,815 B1 | | 7/2002 | Lai et al. |
| 6,451,667 B1 | | 9/2002 | Ning |
| 6,461,914 B1 | | 10/2002 | Roberts et al. |
| 6,468,858 B1 | | 10/2002 | Lou |
| 6,475,889 B1 | * | 11/2002 | Ring .......................... 438/571 |
| 6,528,366 B1 | | 3/2003 | Tu et al. |
| 6,580,111 B2 | | 6/2003 | Kim et al. |
| 6,773,941 B2 | * | 8/2004 | French et al. .................. 438/29 |
| 6,831,291 B2 | * | 12/2004 | Imai .......................... 250/591 |

* cited by examiner

Primary Examiner—David Zarneke
Assistant Examiner—Igwe U. Anya
(74) Attorney, Agent, or Firm—DeLio & Peterson LLC; Robert Curcio; Lisa U. Jacklitsch

(57) ABSTRACT

MIM capacitors and thin film resistors are fabricated with at least one less lithographic step than the prior art methods. The process step reduction is realized by using semi-transparent metallic electrodes, fabricated with a two-mask process, which provides for direct alignment, and eliminates the need for alignment trenches in an additional layer.

21 Claims, 10 Drawing Sheets

TWO-MASK PROCESS FOR METAL-INSULATOR-METAL CAPACITORS AND SINGLE MASK PROCESS FOR THIN FILM RESISTORS

BACKGROUND OF INVENTION

1. Field of the Invention

The present invention relates to a capacitor for a semiconductor device and a manufacturing method thereof, and more particularly, to a two-mask process for manufacturing a capacitor having a metal-insulator-metal structure.

2. Description of Related Art

Capacitors in semiconductor devices are often integrated with active bipolar or MOS transistors for analog and digital circuits. Capacitors of various types have been used in the art, such as polysilicon-insulator-polysilicon (PIP) capacitors, polysilicon-insulator-polycide capacitors, polysilicon-insulator-metal (MIS) capacitors, and metal-insulator-metal (MIM) capacitors. Capacitors in semiconductors are required to maintain large capacitance values even though integration requires capacitor area to continue to decrease. To accommodate, capacitors are being formed near and over transistors, for example at the metal level as opposed to being formed at the transistor level nearer the bulk semiconductor substrate. A MIM capacitor is one such example for accommodating a larger capacitor in a smaller size.

MIM capacitors are planar structures consisting of a thin dielectric sandwiched between two metallic electrodes. MIM capacitors are essential components in radio frequency (RF) analog applications and in mixed digital-analog circuits. The prior art process of record for MIM capacitor fabrication requires at least three lithographic mask levels to add a MIM capacitor onto an otherwise standard interconnect structure. Such processes of record have been utilized in generations of CMOS and RF applications. A three phase lithographic process is an expensive process in cost sensitive markets such as RF communications and ASICs. The need for three lithographic levels arises from the fact that metallic electrodes used in current MIM capacitor technologies are opaque to optical light, and thus prevent the lithography tools from aligning to the previous copper interconnect layer. A process that decreases lithographic steps would reduce complexity and realize a significant cost savings in the MIM capacitor module build. Moreover, in addition to reducing cost, a direct alignment scheme would be more accurate than the current trench alignment scheme of the prior art. In the prior art, trenches are patterned and etched in an oxide layer to form alignment marks for further process steps. A more robust alignment process would also reduce lithographic rework. Further, the reduced mask process may be adaptable to thin film resistor fabrication with similar benefits realized.

FIG. 1 depicts the typical MIM capacitor process flow of the prior art. As shown in FIG. 1A, a silicon oxide ($SiO_2$) layer 12, that is generally used for alignment purposes, is deposited on a semiconductor substrate's nitride layer 10. A first mask or photoresist 14 is applied to pattern the trenches or alignment marks 16. As shown in FIG. 1B, alignment marks 16 are reactive ion etched, and the photoresist removed. FIG. 1C depicts layers of titanium nitride $TiN_x$ 18 and silicon nitride $SiN_x$ 20 that are then deposited on the structure. In FIG. 1C, a second mask or photoresist 22 is used to pattern the MIM capacitor's top electrode. FIG. 1D shows the patterned structure again subjected to a reactive ion etch with the photoresist 22 subsequently removed. In FIG. 1E, a third mask 24 is applied to pattern a bottom electrode. FIG. 1F depicts the structure of FIG. 1E after reactive ion etching. An oxide interlayer dielectric 26 is deposited on the structure of FIG. 1F, and planarized as shown in FIG. 1G. FIG. 1H shows the structure after lines and/or vias 28 are patterned and etched. A metal liner and metal fill 30 are then added to the lines and/or vias 28, and subjected to a chemical-mechanical polish (CMP), as shown in FIG. 1I. The prior art requires this three-mask process due, in part, to the necessity of fabricating a trenched layer of $SiO_2$ for alignment purposes.

In U.S. Pat. No. 6,413,815 issued to Lai et al., on Jul. 2, 2002, entitled, "METHOD OF FORMING A MIM CAPACITOR," three photoresists are used to form a MIM capacitor, as is the general method practiced by the prior art. The first photoresist forms trenches in a dielectric layer for alignment purposes. The second photoresist forms the top electrode of the MIM capacitor, and the third photoresist forms the bottom electrode of the MIM capacitor. The Lai design and other designs in the prior art do not teach or disclose eliminating the formation of alignment trenches by a first photoresist application as does the present invention.

The $TiN_x$ films currently used in MIM capacitor processes are opaque to the transmission of visible light. Further, due to the highly planar copper surface below the MIM capacitor, the $TiN_x$ layer acts as a specularly reflective mirror preventing the proper alignment and overlay measurements. To overcome these problems, the prior art process of record requires the introduction of topography, such as trenches and the like, into the reflecting surface. This topography is achieved by using an extra masking level, followed by a reactive ion etch step. A $TiN_x/SiN_x$ film stack conformally covers the resulting alignment marks, which are typically 350 Angstroms deep in the sacrificial oxide film. The 350 Angstrom topography in the otherwise mirror-like structure leads to non-specular reflected light, which allows for alignment and overlay to the copper level below. The elimination of this mask step and trench formation is a significant advancement over the current prior art.

FIG. 2 depicts the two-mask prior art process for fabricating thin film resistors. First, as shown in FIG. 2A, a layer of $SiO_2$ 204 is deposited on the nitride layer 202 of a substrate 200 and patterned with a first photoresist mask 206. The mask is designed to allow trenches to be etched within the $SiO_2$ layer. FIG. 2B depicts the $SiO_2$ layer 204 with trenches 208 present after a reactive ion etch. Next, as shown in FIG. 2C, resistor material 210, such as $TiN_x$ is deposited and patterned with a second photoresist mask 212, aligned to the trench marks 208 of the previous process step. The substrate is subjected to a second reactive ion etch, and the photoresist 212 is then stripped. The resultant patterned structure is depicted in FIG. 2D. The patterned resistor material 210 is shown for the desired resistor structure. Notably, two masks are used in this prior art process to fabricate the thin film resistor.

Bearing in mind the problems and deficiencies of the prior art, it is therefore an object of the present invention to provide a process for fabricating MIM capacitors that decreases the lithographic steps.

It is another object of the present invention to provide a process for fabricating MIM capacitors that allows for a more accurate direct alignment scheme than the current trench alignment scheme.

A further object of the invention is to provide a process for fabricating MIM capacitors that allows for lithography tools to align to a previous copper interconnect layer without the need for trench alignment marks.

It is another object of the present invention is to eliminate the need to create topography for decreasing reflectivity within device structure.

It is yet another object of the present invention to provide a reduced mask process for application to a thin film resistor.

Still other objects and advantages of the invention will in part be obvious and will in part be apparent from the specification.

SUMMARY OF INVENTION

The above and other objects and advantages, which will be apparent to one of skill in the art, are achieved in the present invention, which is directed to, in a first aspect, a method of fabricating a MIM capacitor on a semiconductor wafer comprising depositing semi-transparent metal layers for top and bottom electrodes of the MIM capacitor. The metal layers comprise a low resistance, high transmittance metal. Additionally, the semi-transparent metal layers may be at least transparent in a portion of the visible spectrum. The semi-transparent metal layers may also comprise indium-tin-oxide. The method further comprises: depositing a layer of dielectric material between the semi-transparent metal layers; patterning and etching the top and bottom electrodes from the dielectric material and the semi-transparent metal layers, such that the bottom electrode aligns to a previous metal interconnect layer; depositing an interlayer dielectric over the top and bottom electrodes; forming lines through the interlayer dielectric to the top and bottom electrodes; and depositing a metal liner and metal fill in the lines.

In a second aspect, the present invention is directed to a method of fabricating a MIM capacitor on a semiconductor wafer having an insulating layer thereon, the method comprising: depositing alternate layers of a dielectric material and a semi-transparent metal on the insulating layer; patterning and etching the dielectric layer and the semi-transparent metal layer to form a top electrode; patterning and etching the capacitor dielectric layer and the semi-transparent metal layer to form a bottom electrode, such that the bottom electrode aligns to a previous metal interconnect layer; depositing an oxide interlayer dielectric over the top and bottom electrodes; patterning and etching the oxide interlayer dielectric to form lines to the top and bottom electrodes; and depositing a metal liner and metal fill in the lines. The semi-transparent metal may comprise a low resistance, high transmittance metal, at least semi-transparent in a portion of the visible spectrum. The semi-transparent metal may be indium-tin-oxide. The indium-tin-oxide metal demonstrates a resistivity in the range of 230 $\mu$ohm-cm after exposure to an annealing temperature of approximately 250° C. in a $N_2H_2$ atmosphere.

In a third aspect, the present invention is directed to a method of fabricating a thin film resistor on a semiconductor wafer comprising depositing semi-transparent resistor material to eliminate a mask alignment process step. The semi-transparent resistor material is indium-tin-oxide, or other metallic material at least transparent in a portion of the visible spectrum. The method further comprises: depositing a $SiN_x$ cap layer over the interconnect copper layer; depositing a layer of semi-transparent resistor material over the $SiN_x$ cap; and patterning and etching the semi-transparent resistor material with a photoresist mask, such that the resistor material aligns to the interconnect copper layer.

BRIEF DESCRIPTION OF DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION

Figure 1A:
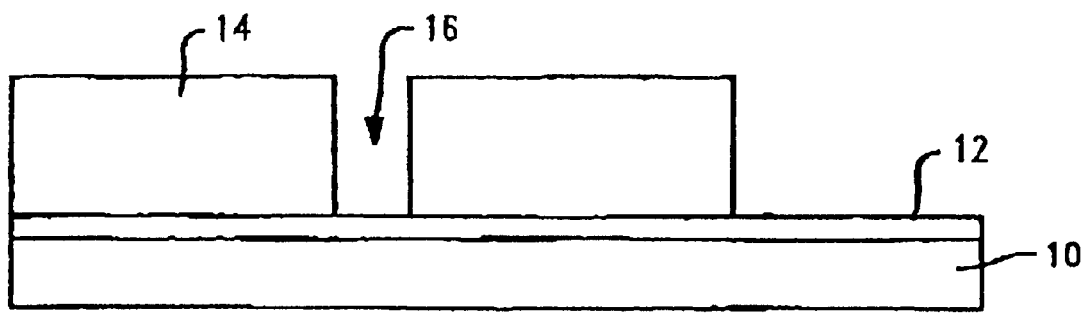
FIG. 1 depicts the MIM capacitor process flow of the prior art.
Figure 1B:
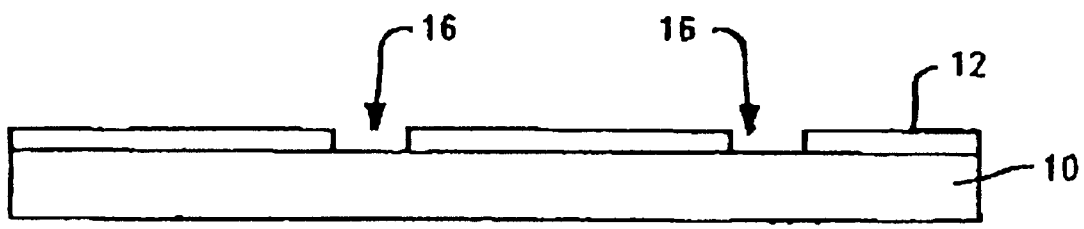
Figure 1C:
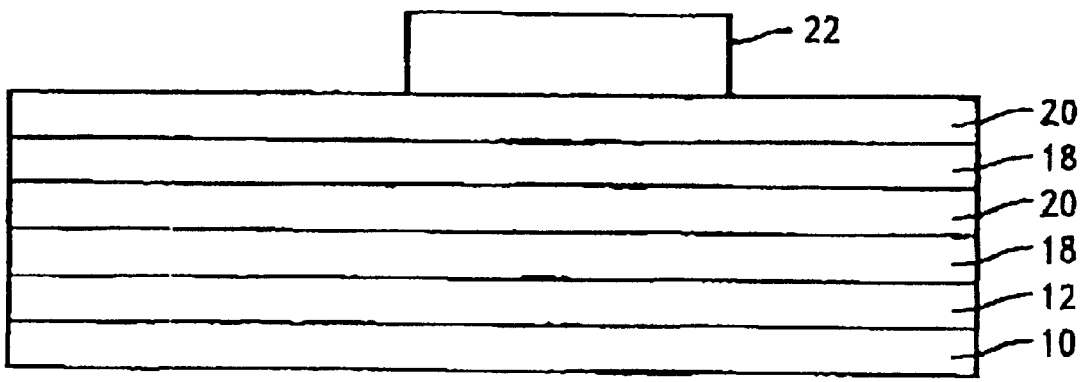
Figure 1D:
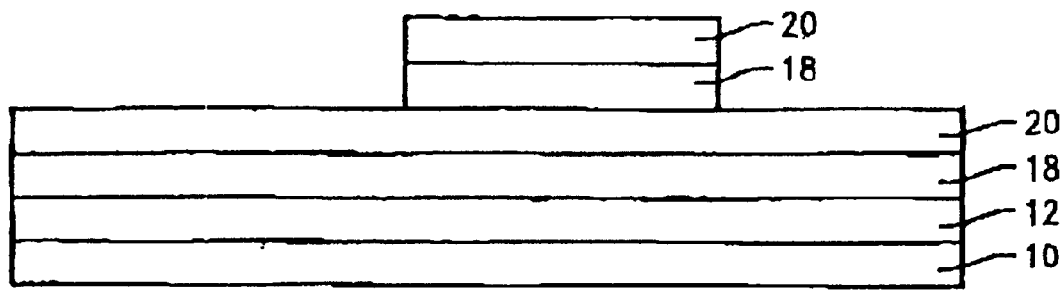
Figure 1E:
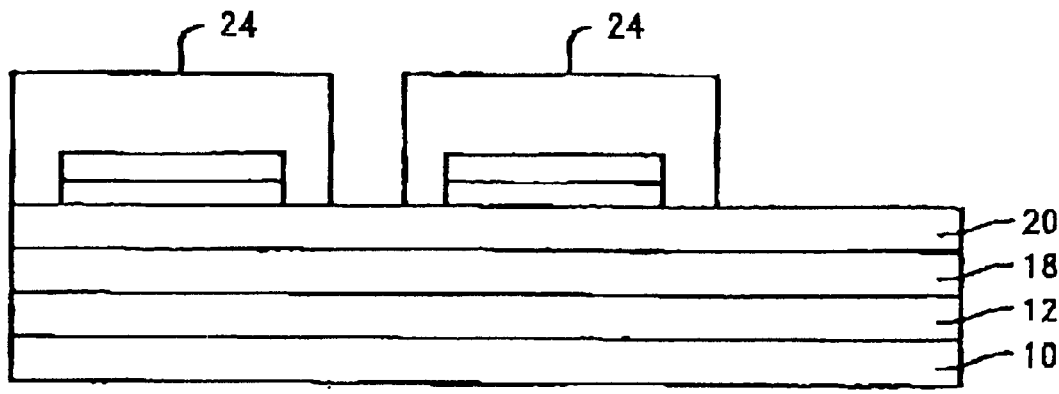
Figure 1F:
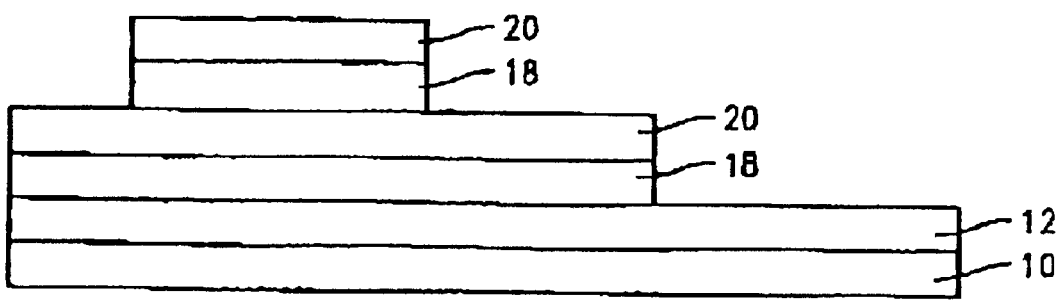
Figure 1G:
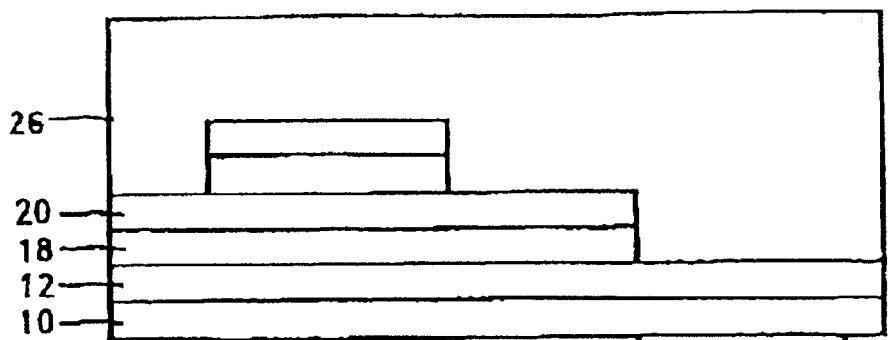
Figure 1H:
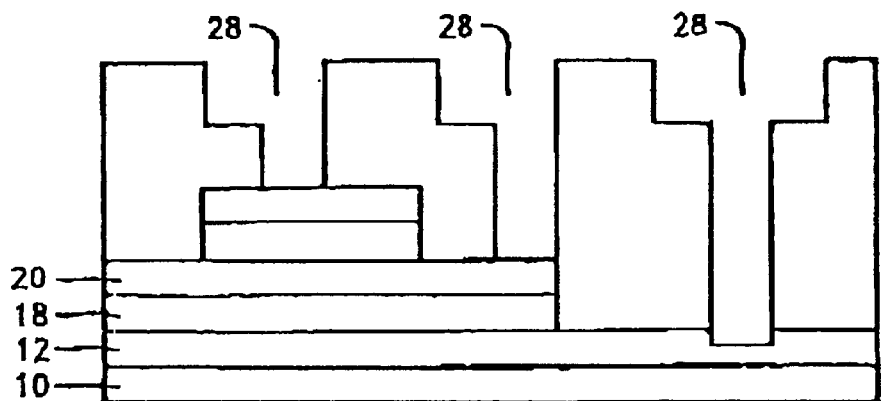
Figure 1I:
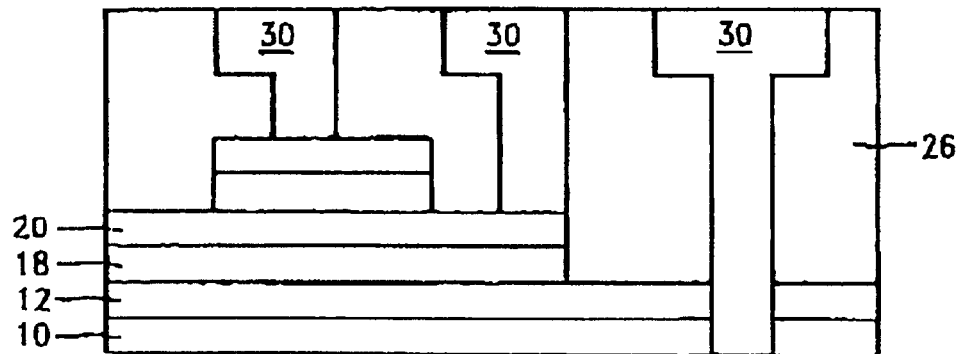
Figure 2A:
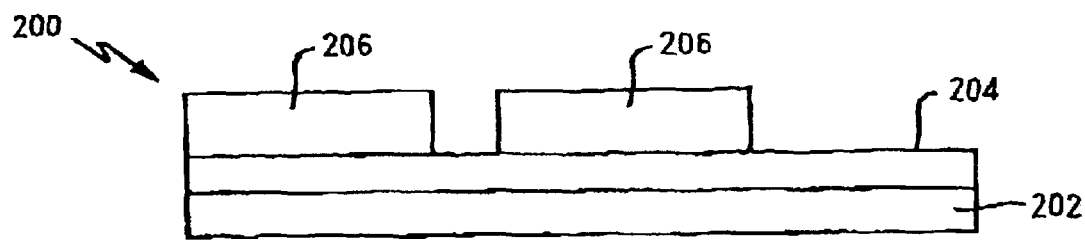
FIG. 2 depicts the two-mask prior art process for fabricating thin film resistors.
Figure 2B:
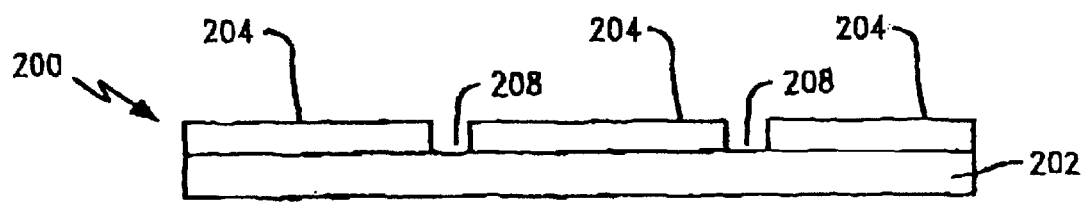
Figure 2C:
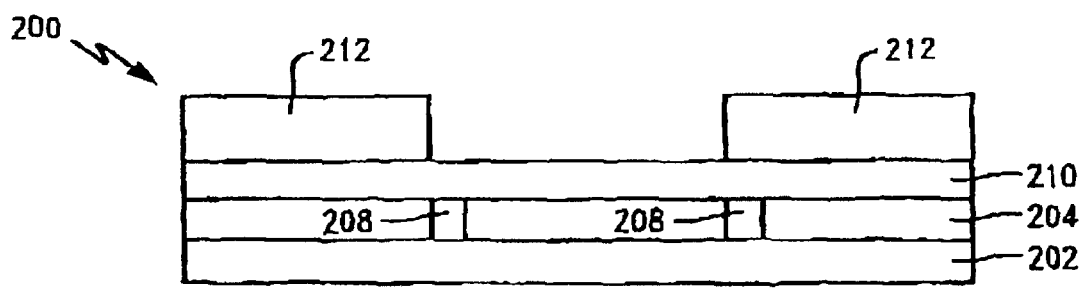
Figure 2D:
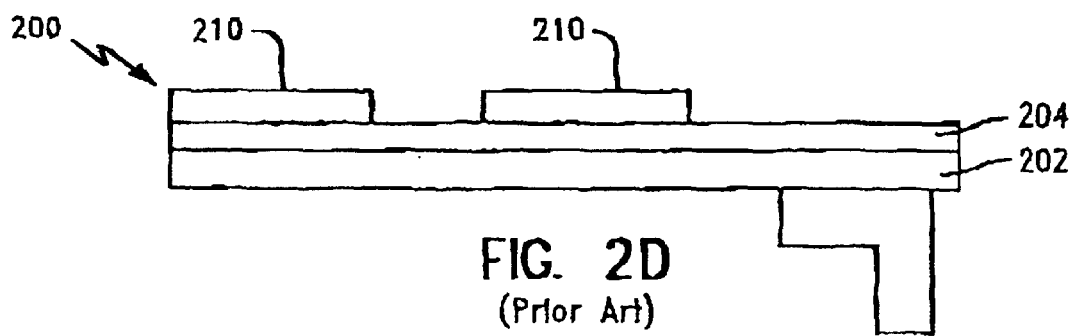

In describing the preferred embodiment of the present invention, reference will be made herein to FIGS. 1–6 of the drawings in which like numerals refer to like features of the invention. Features of the invention are not necessarily shown to scale in the drawings.

Disclosed is a means to build MIM capacitors and thin film resistors with at least one less lithographic step than the prior art methods. The process step reduction is realized by using semi-transparent metallic electrodes having metal transparent in at least a portion of the visible spectrum, and fabricated with a two-mask process, which provides for direct alignment, and eliminates the need for alignment trenches in an insulating or oxide layer, such as $SiO_2$.

The present invention replaces the prior art $TiN_x$ top and bottom MIM capacitor electrodes with indium-tin-oxide (ITO). ITO is a semi-transparent metal having a resistance lower than $TiN_x$. The ITO film is transparent in at least a portion of the visible region of the spectrum. The transparency allows for direct alignment and overlay measurements to the copper interconnect level below the MIM capacitor. This transparency eliminates the need for the alignment level lithographic process steps used in the prior art fabrication of MIM capacitors and thin film resistor builds. The lower resistance presented by the ITO material yields a smaller voltage drop on the bottom plate, which is advantageous to the capacitor functionality. If resistance is too large, the voltage drop is greater and device performance is jeopardized.

ITO is a wide band-gap material characterized by a high optical transparency in the visible spectrum. Optical transparency is the ratio of transmitted-to-incident light intensity. ITO material is also characterized by a metallic resistivity of approximately 230 $\mu$ohm-cm after exposure to an annealing temperature of approximately 250° C. in a $N_2H_2$ atmosphere. Some applications where ITO material may be employed pursuant to the process of the present invention include the bottom electrode in flat panel display pixels, as a transparent contact to semiconductors in opto-electronic applications, such as LEDs and solar cells, and as an anti-static coating in instrument panels.

Figure 3:
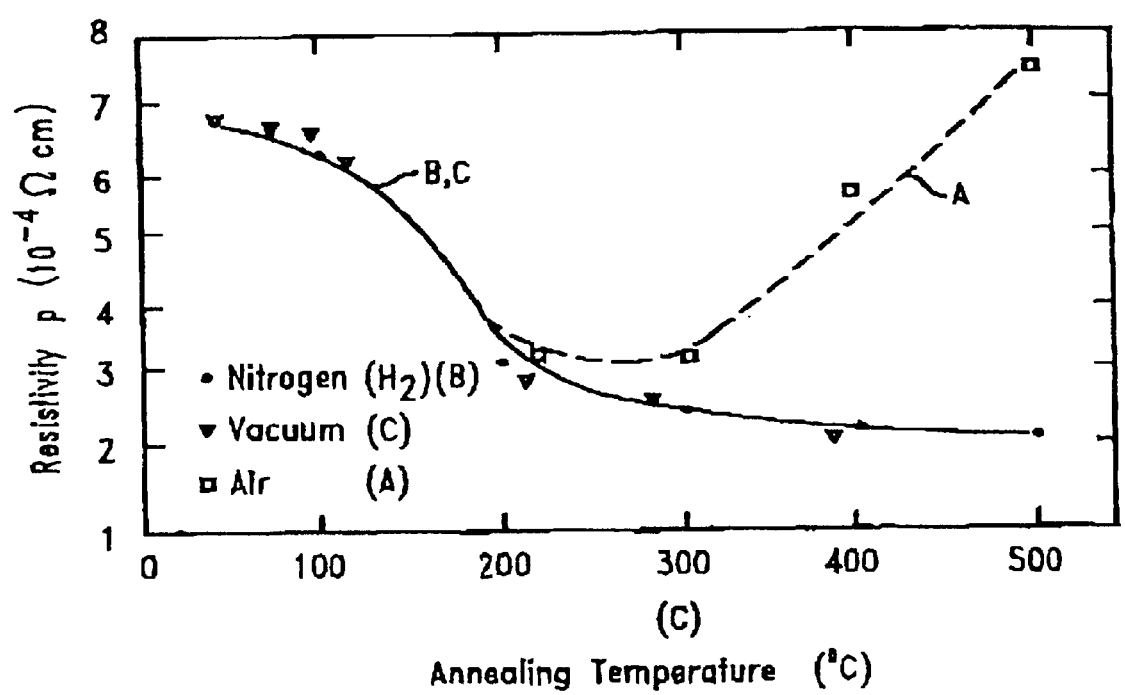
FIG. 3 is a graph of the changes in resistivity for sputtered, deposited indium-tin-oxide material as a function of annealing temperature in air, $N_2/H_2$, and vacuum.

FIG. 3 is a graph of the changes in resistivity for sputtered, deposited ITO material as a function of annealing temperature in air, $N_2/H_2$, and vacuum, as listed in D. V.

Morgan et al., 312 Thin Solid Films, p.268–272 (1998). As indicated, ITO resistivity, which is on the order of 230 µohm-cm, is lower than the process of record material $TiN_x$ of 400 µohm-cm. This reduced resistivity improves MIM capacitor performance. As noted in FIG. 3, the resistivity is substantially higher when annealed in air, Line A, but remains consistently lower when annealed in $N_2/H_2$ or a vacuum, Lines B and C respectively.

Figure 4:
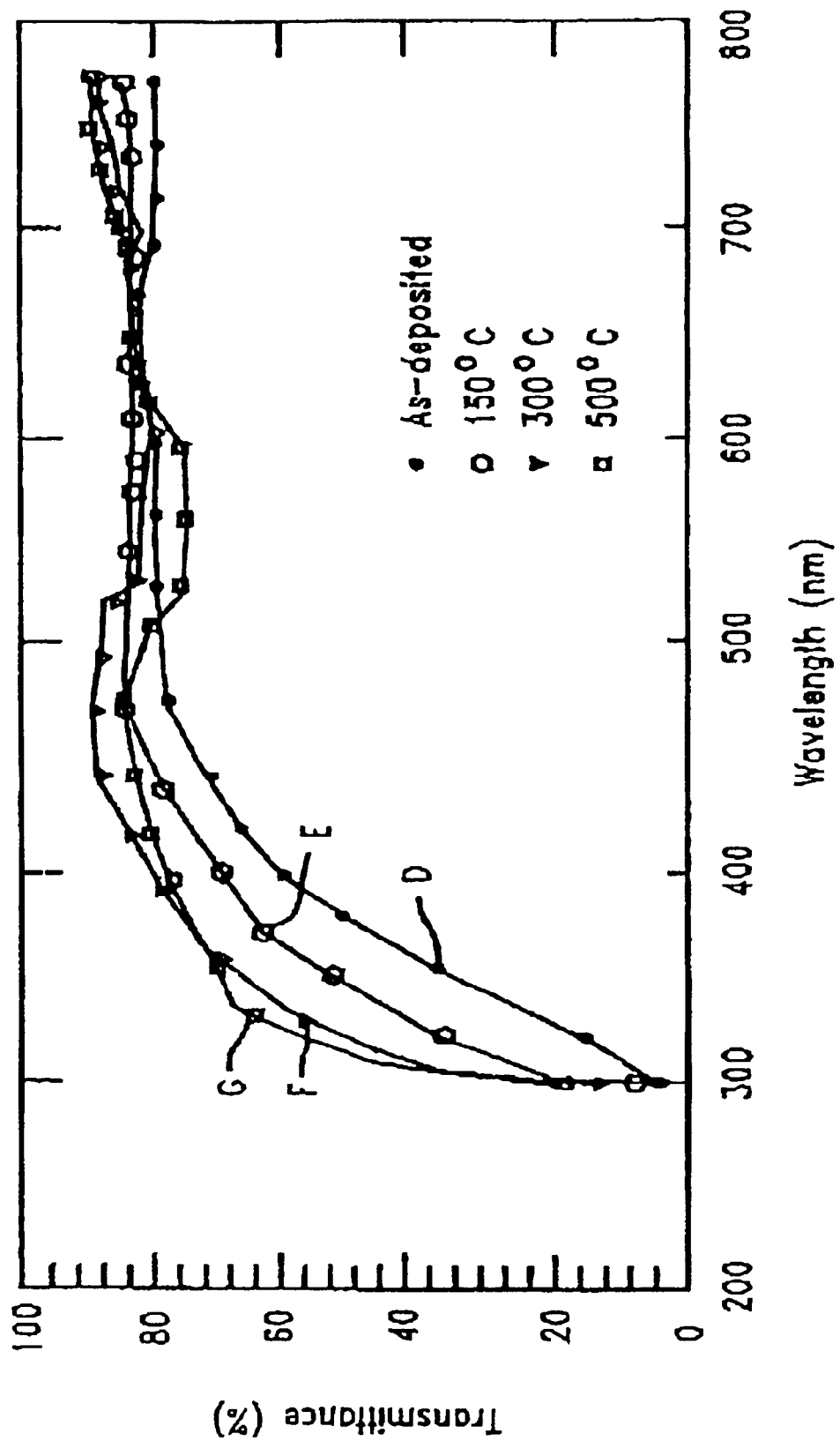
FIG. 4 depicts the transmittance of sputtered, deposited indium-tin-oxide material as a function of annealing temperature.

FIG. 4 depicts the transmittance of sputtered, deposited ITO material as a function of annealing temperature over most of the visible spectrum (200 nm–800 nm). Line D depicts the transmittance of a sputtered film of ITO material as deposited, as a function of wavelength. As noted, the percent of transmittance increases at lower wavelengths as a function of the anneal temperature applied. Lines E, F, and G depict the transmittance to wavelength relationship for 150° C., 300° C., and 500° C., respectively. Importantly, alignments and overlays are performed in the visible spectrum. The wavelength range of interest is generally 5000–6500 Angstroms, used by optical lithography tools to align reticles to the level below. A Nikon MUV uses a 633 nm laser with 550–750 nm broadband, with a center at 650 nm. An ASML MUV uses a 633 nm laser and a 532 nm laser for red and green lines, respectively. Generally for overlay, four broadband lights are used: deep red, centered at 650 nm; red, centered at 600 nm; green, centered at 550 nm; and blue centered at 480 nm. The transparency of the ITO layer facilitates self-alignment and overlay processes in the visible spectrum.

The properties of low resistance and high transmittance over the visible spectrum make ITO material a suitable choice for MIM capacitor and thin film resistor fabrication. Device integrity is sustained while manufacturing process steps are eliminated.

FIG. 5 depicts the two-mask MIM capacitor process flow of the present invention. A planar type capacitor is developed here; however, the capacitor according to the present invention can have a variety of shapes, and is not limited to a planar design alone. The first step in the process is to form the top electrode on a semiconductor wafer. The wafer may comprise silicon or other semiconductor materials, such as gallium arsenide and silicon-on-insulator (SOI). The wafer generally has at least one conductive interconnect line in its topmost layer, and is covered by an insulating layer, such as a nitride layer. Formation of the top electrode is initiated by depositing alternating layers of ITO 102 and $SiN_x$ 104, as shown in FIG. 5A, over a nitride cap layer 106. The $SiN_x$ 104 represents the capacitor dielectric. This may be deposited by plasma enhanced chemical vapor deposition (PECVD), for example. Alternatively, the capacitor dielectric may comprise other dielectric materials. The capacitor dielectric is generally relatively thin and conformal. Usually, at least a portion of these layers is deposited over at least one metallic line or interconnect (not shown) in the wafer, usually consisting of a copper based material. If copper is used for the first conductive interconnect lines, there is a tendency for this material to diffuse into the underlying and overlying dielectrics unless a cap layer is used for protection, such as the nitride layer 106.

Figure 5A:
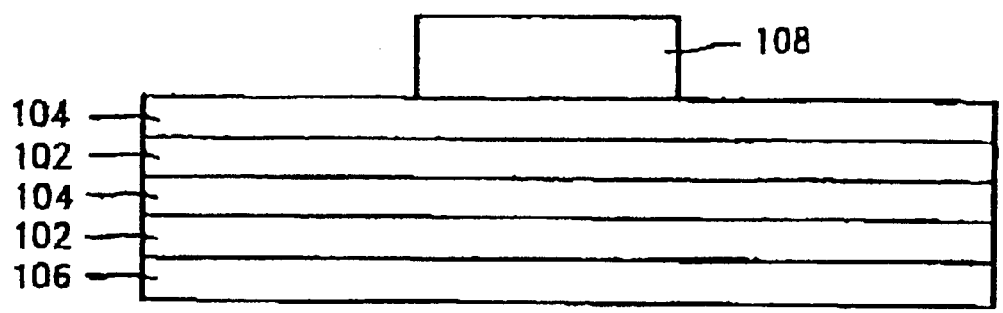
FIG. 5 depicts the two-mask MIM capacitor process flow of the present invention.
Figure 5B:
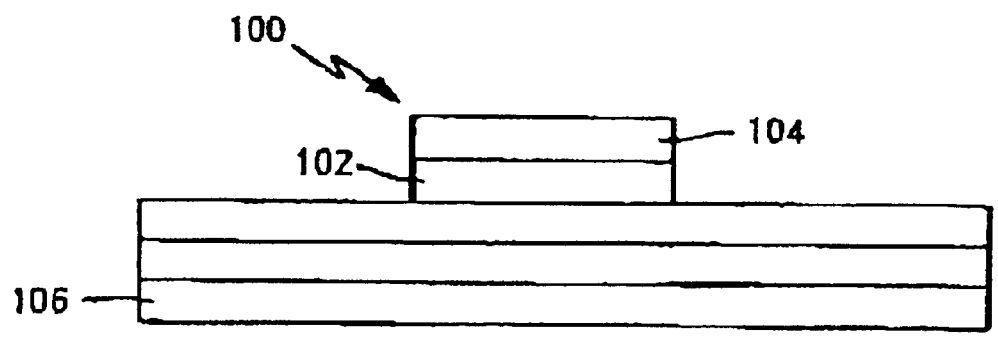

A mask or photoresist 108 is applied for patterning the ITO and $SiN_x$ layers. Photoresist 108 typically comprises an organic polymer. A lithography mask, not shown, is used to pattern the photoresist 108 to define the shape, size, and location of the top electrode. The wafer is exposed to UV light, and developed to remove undesired portions of the photoresist using either a positive or negative exposure process, leaving the structure shown in FIG. 5A. The wafer is then etched as shown in FIG. 5B. This results in the formation of the top electrode 100 after the subsequent removal of the photoresist 108. The etch process may comprise, for example, a reactive ion etch (RIE) process, although other removal processes may be used. Due to the transparency of the ITO layers, the structure is self-aligned to the underlying conductive interconnect lines. Importantly, the ITO transparency eliminates the need for masking and etching a $SiO_2$ layer or other insulating layer for alignment marking, which is essential in the prior art. Consequently, the first mask used in the prior art and depicted in FIG. 1A is not used in the process of the present invention.

Figure 5C:
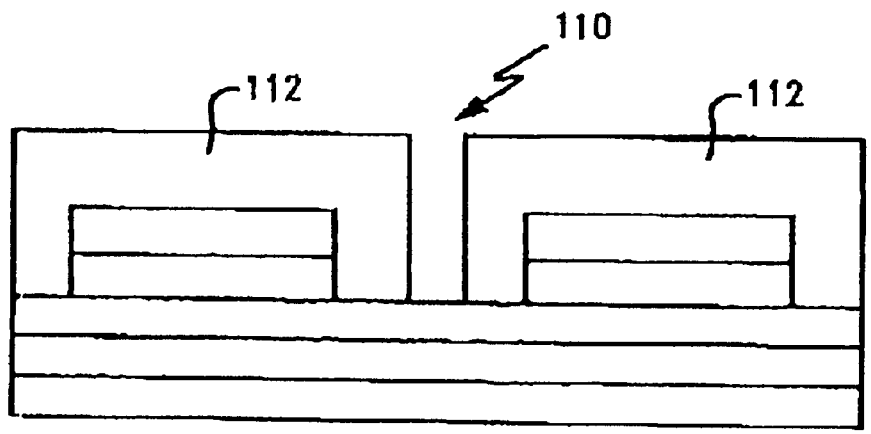
Figure 5D:
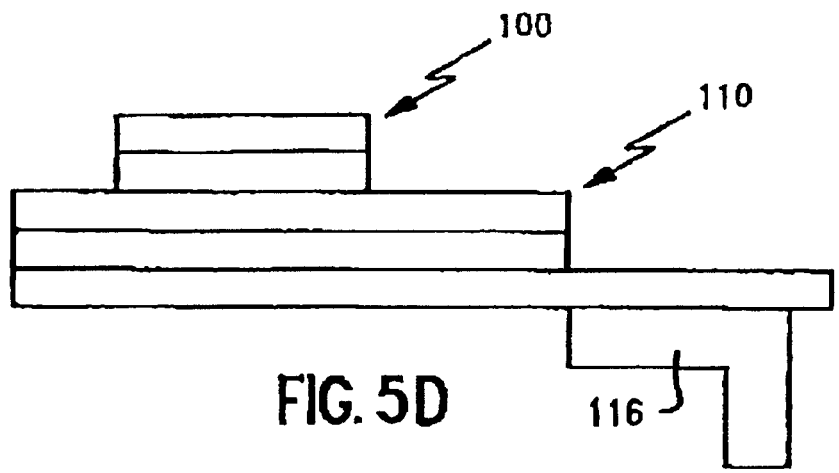
Figure 5E:
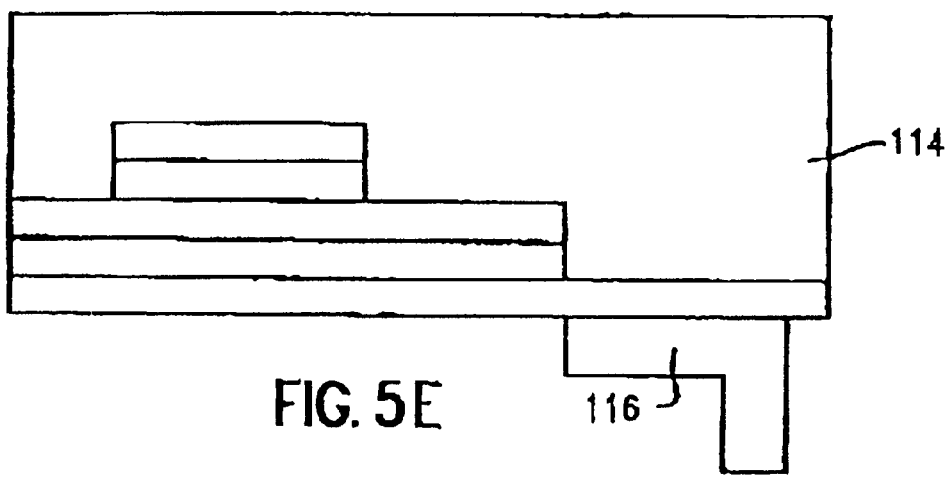
Figure 5F:
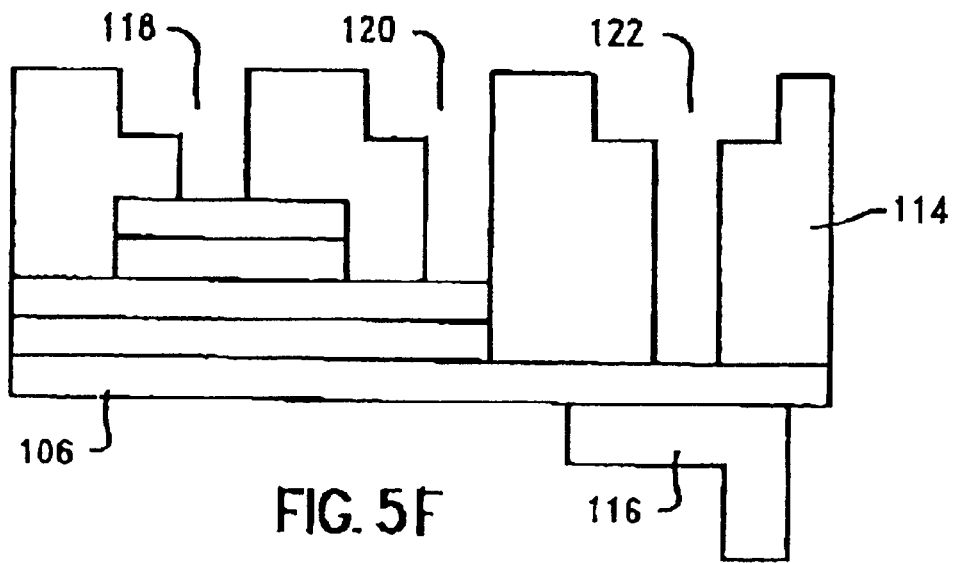

Next, a bottom electrode 110 is patterned as shown in FIG. 5C with a second mask or photoresist 112. The bottom electrode 110 is formed upon a second reactive ion etch and removal of the second mask 112. FIG. 5D depicts both top and bottom electrodes 100, 110 after the second mask and second etch. As previously noted, the prior art would require an additional mask to form the electrodes; the additional mask forming alignment marks in a $SiO_2$ layer. An oxide interlayer dielectric (ILD) 114 is then deposited over the formed electrodes, which are shown formed over a copper line 116 in FIG. 5E. The ILD layer 114 is then line patterned and etched (RIE). FIG. 5F shows the resultant etched lines in the ILD layer. Line 118 is patterned and etched for contact with the top electrode 100. Line 120 is patterned and etched for contact the bottom electrode 110. Line 122 is patterned and etched for the copper line 116.

Figure 5G:
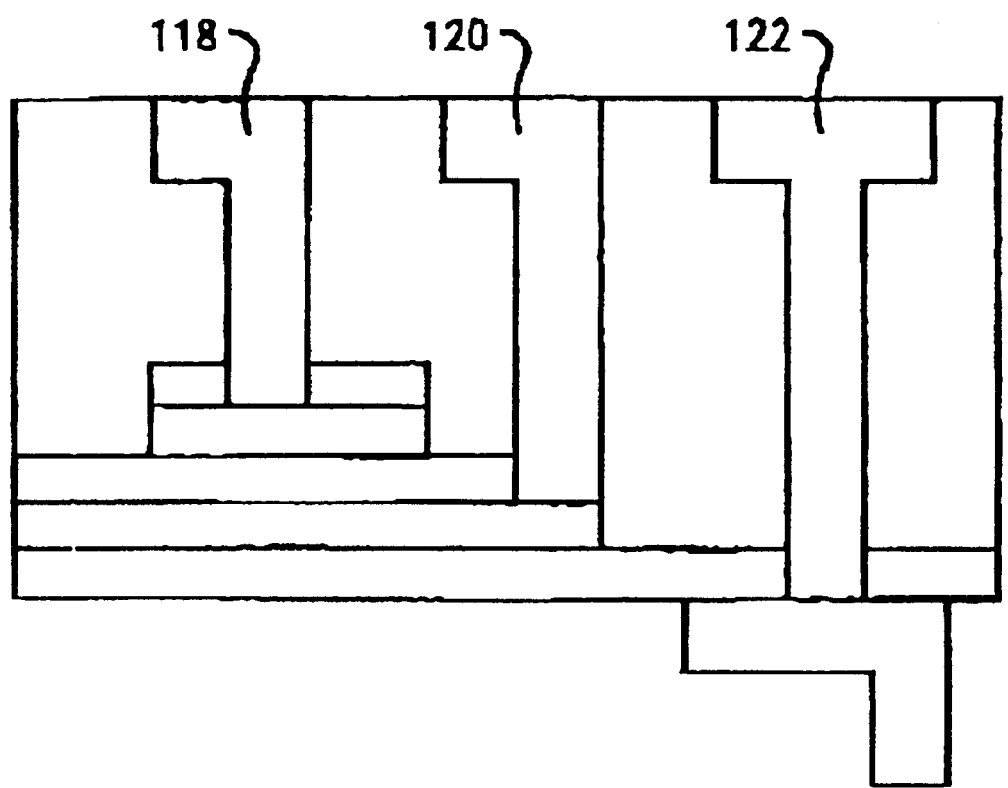

Last, as depicted in FIG. 5G, a metal liner is deposited within the patterned lines 118, 120, and 122, and a metal fill, typically copper based, is deposited to fill the patterned lines. Excessive conductive material is then removed from the surface of the wafer by chemical mechanical polishing (CMP) or other etching process.

By replacing the prior art $TiN_x$ top and bottom MIM capacitor electrodes with a semi-transparent metal that is transparent in at least a portion of the visible region, such as indium-tin-oxide, the process steps for notching an underlying insulating layer are eliminated because the transparency facilitates self-alignment.

In a similar manner, the dual mask process steps for fabricating a thin film resistor, with similar self-alignment considerations, can be reduced to a single mask process through the deposition of a semi-transparent metal like ITO.

Figure 6A:
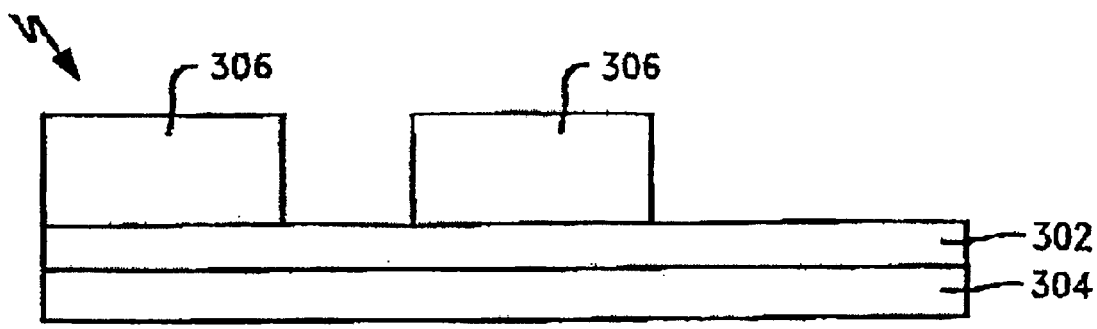
FIG. 6 depicts the single mask thin film resistor process flow of the present invention.
Figure 6B:
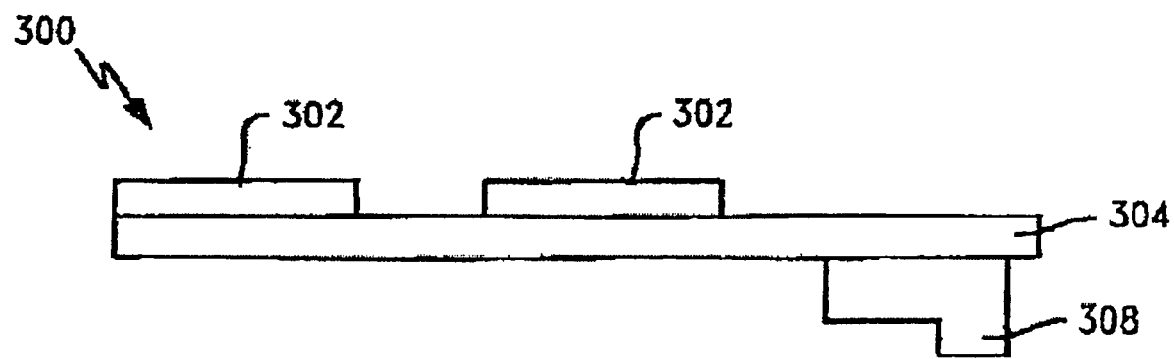

FIG. 6 depicts a single mask process for fabricating a thin film resistor. In FIG. 6A, semi-transparent material 302 is deposited over a $SiN_x$ cap 304 on a substrate 300. The resistor material is preferably indium-tin-oxide (ITO), but may be other conductive, semi-transparent material. The resistor material is semi-transparent in at least a portion of the visible spectrum. The resistor material is patterned using a single photoresist mask 306, which is aligned to the copper 308 in the level below. As shown in FIG. 6B, portions of the resistor material 302 is removed, preferably with a reactive ion etch process, and the photoresist mask developed and stripped away. The process requires only one mask because the material is transparent in at least a portion of the visible spectrum, which allows for direct alignment to the copper level below without the formation of the prior art alignment trenches.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any Thus, having described the invention, what is claimed is:

1. A method of fabricating a MIM capacitor comprising:
   providing a semiconductor wafer; and
   depositing semi-transparent metal layers for top and bottom electrodes of said MIM capacitor using a two-mask process for direct alignment;
   said method eliminating the need for alignment trenches in an insulating or oxide layer.

2. The method of claim 1 wherein said metal layers comprise a low resistance, high transmittance metal.

3. The method of claim 1 wherein said semi-transparent metal layers are at least transparent in a portion of the visible spectrum.

4. The method of claim 1 wherein said semi-transparent metal layers comprise indium-tin-oxide.

5. A method of fabricating a MIM capacitor comprising:
   providing a semiconductor wafer;
   depositing semi-transparent metal layers on said semiconductor wafer for top and bottom electrodes of said MIM capacitor using a two-mask process for direct alignment and eliminating the need for alignment trenches in an insulating or oxide layer;
   depositing a layer of dielectric material between said semi-transparent metal layers;
   patterning and etching said top and bottom electrodes from said dielectric material and said semi-transparent metal layers, such that said bottom electrode aligns to a previous metal interconnect layer;
   depositing an interlayer dielectric over said top and bottom electrodes;
   forming lines through said interlayer dielectric to said top and bottom electrodes; and
   depositing a metal liner and metal fill in said lines.

6. The method of claim 5 further comprising planarizing said interlayer dielectric.

7. The method of claim 5 further comprising chemical-mechanical polishing said MIM capacitor after depositing said metal liner and metal fill.

8. A method of fabricating a MIM capacitor on a semiconductor wafer having an insulating layer thereon, said method comprising:
   providing said semiconductor wafer having said insulating layer thereon;
   depositing alternate layers of a dielectric material and a semi-transparent metal on said insulating layer;
   patterning and etching said dielectric layer and said semi-transparent metal layer to form a top electrode;
   performing direct alignment to a previous metal interconnect layer through said semi-transparent metal layer;
   patterning and etching said capacitor dielectric layer and said semi-transparent metal layer to form a bottom electrode;
   depositing an oxide interlayer dielectric over said top and bottom electrodes;
   patterning and etching said oxide interlayer dielectric to form lines to said top and bottom electrodes; and
   depositing a metal liner and metal fill in said lines.

9. The method of claim 8 wherein said semi-transparent metal comprises a low resistance, high transmittance metal, at least semi-transparent in a portion of the visible spectrum.

10. The method of claim 8 wherein said semi-transparent metal comprises indium-tin-oxide.

11. The method of claim 10 further comprising indium-tin-oxide metal having a resistivity in the range of 230 mohm-cm after exposure to an annealing temperature of approximately 250° C. in a $N_2H_2$ atmosphere.

12. The method of claim 8 wherein said capacitor dielectric comprises SiNx.

13. The method of claim 8 further comprising planarizing said interlayer dielectric after depositing said interlayer dielectric.

14. The method of claim 8 further comprising removing excessive conductive material by chemical-mechanical polishing after depositing said metal liner and metal fill deposition.

15. The method of claim 8 wherein said patterning comprises applying a photoresist mask and developing said mask with ultraviolet light.

16. The method of claim 8 wherein said etching comprises performing reactive ion etching.

17. A method of fabricating a thin film resistor comprising:
   providing a semiconductor wafer;
   depositing a SiNx cap layer over an interconnect copper layer;
   depositing a layer of semi-transparent resistor material over said SiNx cap; and
   patterning and etching said semi-transparent resistor material with a photoresist mask, such that said resistor material aligns to said interconnect copper layer.

18. The method of claim 17 wherein said resistor material is indium-tin-oxide, or other metallic material at least transparent in a portion of the visible spectrum.

19. A method of fabricating a MIM capacitor, said method comprising:
   providing a semiconductor wafer having an insulating layer thereon;
   depositing alternate layers of a dielectric material and a semi-transparent metal on said insulating layer, wherein said semi-transparent metal comprises indium-tin-oxide having a resistivity in the range of 230 mohm-cm after exposure to an annealing temperature of approximately 250° C. in a $N_2H_2$ atmosphere;
   patterning and etching said dielectric layer and said semi-transparent metal layer to form a top electrode;
   patterning and etching said capacitor dielectric layer and said semi-transparent metal layer to form a bottom electrode, such that said bottom electrode aligns to a previous metal interconnect layer;
   depositing an oxide interlayer dielectric over said top and bottom electrodes;
   patterning and etching said oxide interlayer dielectric to form lines to said top and bottom electrodes; and
   depositing a metal liner and metal fill in said lines.

20. A method of fabricating a thin film resistor comprising:
   providing a semiconductor wafer;
   depositing a SiNx cap layer over an interconnect copper layer on said semiconductor wafer;
   depositing a layer of semi-transparent resistor material over said SiNx cap to eliminate a mask alignment process step; and
   patterning and etching said semi-transparent resistor material with a photoresist mask, such that said resistor material aligns to said interconnect copper layer.

21. The method of claim 20 wherein said resistor material is indium-tin-oxide, or other metallic material at least transparent in a portion of the visible spectrum.

* * * * *